US010515588B2

United States Patent
Yuan et al.

(10) Patent No.: US 10,515,588 B2
(45) Date of Patent: Dec. 24, 2019

(54) DETECTION METHOD FOR PIXEL CIRCUIT, DRIVING METHOD FOR DISPLAY PANEL AND DISPLAY PANEL

(71) Applicants: BOE Technology Group Co., Ltd., Beijing (CN); Hefei Xinsheng Optoelectronics Technology Co., Ltd., Hefei (CN)

(72) Inventors: Zhidong Yuan, Beijing (CN); Yongqian Li, Beijing (CN); Pan Xu, Beijing (CN); Can Yuan, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 16/116,265

(22) Filed: Aug. 29, 2018

(65) Prior Publication Data

US 2019/0304362 A1    Oct. 3, 2019

(30) Foreign Application Priority Data

Mar. 27, 2018   (CN) .......................... 2018 1 0258266

(51) Int. Cl.
| | |
|---|---|
| G09G 5/00 | (2006.01) |
| G09G 3/3233 | (2016.01) |
| G09G 3/3266 | (2016.01) |
| G09G 3/3291 | (2016.01) |
| H01L 27/32 | (2006.01) |

(52) U.S. Cl.
CPC ......... *G09G 3/3233* (2013.01); *G09G 3/3266* (2013.01); *G09G 3/3291* (2013.01); *H01L 27/3276* (2013.01); *G09G 2300/043* (2013.01); *G09G 2310/0264* (2013.01); *G09G 2310/08* (2013.01)

(58) Field of Classification Search
CPC ... G09G 2300/0852; G09G 2300/0861; G09G 2320/029; G09G 2320/045; G09G 3/3225; G09G 3/3233; G09G 3/3291
See application file for complete search history.

(56) References Cited

U.S. PATENT DOCUMENTS

2016/0358548 A1* 12/2016 Matsuda ............... G09G 3/2011
2017/0193908 A1* 7/2017 Wang ................. G09G 3/3233

* cited by examiner

*Primary Examiner* — Insa Sadio
(74) *Attorney, Agent, or Firm* — Banner & Witcoff, Ltd.

(57) ABSTRACT

A detection method for a pixel circuit, a driving method for a display panel and a display panel are disclosed. The pixel circuit includes a driving transistor including a gate electrode, and a first terminal connected to a sensing line. The detection method includes: applying a data voltage and a setting voltage to the driving transistor so as to obtain a sensed voltage and obtaining a threshold voltage of the driving transistor based on the data voltage, the setting voltage and the sensed voltage. The data voltage and the setting voltage are respectively applied to the gate electrode and the first terminal so as to set the driving transistor to be in a saturation region, the gate electrode is set to be in a suspension state when the driving transistor is maintained in the saturation region, and the sensed voltage is obtained after a pre-determined time period.

20 Claims, 8 Drawing Sheets

DETECTION METHOD FOR PIXEL CIRCUIT, DRIVING METHOD FOR DISPLAY PANEL AND DISPLAY PANEL

CROSS-REFERENCE TO RELATED APPLICATIONS

This application claims priority to and the benefit of Chinese Patent Application No. 201810258266.4, filed on Mar. 27, 2018, which application is incorporated herein in its entirety.

TECHNICAL FIELD

Embodiments of the present disclosure relate to a detection method for a pixel circuit, a driving method for a display panel and a display panel.

BACKGROUND

Organic Light Emitting Diode (OLED) display panels have gradually attracted the attention of people due to characteristics such as wide viewing angle, high contrast, fast response compared with conventional display panels, and advantages such as higher luminance, lower driving voltage and the like compared with inorganic light emitting diode display devices. Because of the above-mentioned characteristics, the organic light emitting diode (OLED) display panels can be applied into mobile phones, displays, laptops, digital cameras, instruments, and any devices with display functions.

SUMMARY

At least one embodiment of the present disclosure provides a detection method for a pixel circuit, the pixel circuit comprises a driving transistor, the driving transistor comprises a gate electrode and a first terminal, the first terminal of the driving transistor is electrically connected to a sensing line, the detection method comprises: applying a data voltage and a setting voltage to the driving transistor so as to obtain a sensed voltage; and obtaining a threshold voltage of the driving transistor based on the data voltage, the setting voltage and the sensed voltage. The data voltage and the setting voltage are respectively applied to the gate electrode and the first terminal of the driving transistor so as to set the driving transistor to be in a saturation region, the gate electrode of the driving transistor is set to be in a suspension state when the driving transistor is maintained in the saturation region, and the sensed voltage is obtained through the sensing line after a pre-determined time period.

For example, in at least one example of the detection method for the pixel circuit, the data voltage and the setting voltage are applied so as to set the driving transistor to be in a deep saturation region.

For example, in at least one example of the detection method for the pixel circuit, applying of the data voltage and the setting voltage to the driving transistor so as to obtain the sensed voltage comprises: performing a first detection operation, and applying a first data voltage and a first setting voltage to the driving transistor so as to obtain a first sensed voltage, and performing a second detection operation, and applying a second data voltage and a second setting voltage to the driving transistor so as to obtain a second sensed voltage; and the threshold voltage of the driving transistor is obtained based on the first data voltage, the second data voltage, the first setting voltage and the second setting voltage.

For example, in at least one example of the detection method for the pixel circuit, the first data voltage is not equal to the second data voltage; and the first setting voltage is equal to the second setting voltage.

For example, in at least one example of the detection method for the pixel circuit, both the first setting voltage and the second setting voltage are equal to zero.

For example, in at least one example of the detection method for the pixel circuit, the first data voltage is smaller than the second data voltage.

For example, in at least one example of the detection method for the pixel circuit, the first detection operation and the second detection operation are performed continuously.

For example, in at least one example of the detection method for the pixel circuit, a pre-determined time gap is provided between adjacent display periods; and the first detection operation and the second detection operation are performed in same one pre-determined time gap.

For example, in at least one example of the detection method for the pixel circuit, a time length of a first pre-determined time period for the first detection operation is equal to a second time length of a pre-determined time period for the second detection operation.

For example, in at least one example of the detection method for the pixel circuit, the threshold voltage is obtained through a following equation:

$$Vth = \frac{Vgs2 - Vgs1\sqrt{Vvc2/Vvc1}}{1 - \sqrt{Vvc2/Vvc1}},$$

where Vth is the threshold voltage, Vgs1 is a voltage difference between the first data voltage and the first setting voltage, Vgs2 is a voltage difference between the second data voltage and the second setting voltage, Vvc1 is the first sensed voltage, and Vvc2 is the second sensed voltage.

For example, in at least one example of the detection method for the pixel circuit, the pixel circuit further comprises a first transistor and a storage capacitor, a first terminal of the first transistor and a second terminal of the first transistor are respectively connected to a signal line and the gate electrode of the driving transistor, a first terminal of the storage capacitor and a second terminal of the storage capacitor are respectively connected to the gate electrode of the driving transistor and the first terminal of the driving transistor; and the detection method further comprises: applying the data voltage to the driving transistor through turning on the first transistor, and setting the gate electrode of the driving transistor to be in the suspension state through turning off the first transistor.

For example, in at least one example of the detection method for the pixel circuit, the pixel circuit further comprises a second transistor, a first terminal of the second transistor is connected to the first terminal of the driving transistor, and a second terminal of the second transistor is connected to the sensing line; and the detection method further comprises: applying the setting voltage to the first terminal of the driving transistor through the second transistor.

At least one embodiment of the present disclosure further provides a driving method for a display panel, the display panel comprises a pixel circuit and a sensing line, the pixel circuit comprises a driving transistor, the driving transistor comprises a gate electrode and a first terminal, the first terminal of the driving transistor is electrically connected to the sensing line, the driving method comprises: performing the detection method, provided by any one of the embodiments of the present disclosure, to the pixel circuit, so as to obtain the threshold voltage of the driving transistor of the pixel circuit.

For example, in at least one example of the driving method for the display panel, the driving method further comprises: establishing a compensation value of the pixel circuit according to the threshold voltage.

At least one embodiment of the present disclosure further provides a display panel, the display panel comprises a pixel circuit, a sensing line and a control circuit, the pixel circuit comprises a driving transistor, the driving transistor comprises a gate electrode and a first terminal, the first terminal of the driving transistor is electrically connected to the sensing line; and the control circuit is configured to perform the detection method provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Organic light-emitting diode (OLED) display panels generally adopt matrix driving mode. OLED display panels can be divided into active matrix driving mode and passive matrix driving mode according to whether or not a switching component is introduced in each pixel unit. AMOLED (i.e., active matrix OLED) display panels provide a set of thin film transistors and storage capacitors in a pixel circuit of each pixel unit, and the driving current flowing through an OLED can be controlled through controlling the thin film transistors and the storage capacitors, such that the OLED can emit light according to implementation demand.

Figure 1A:
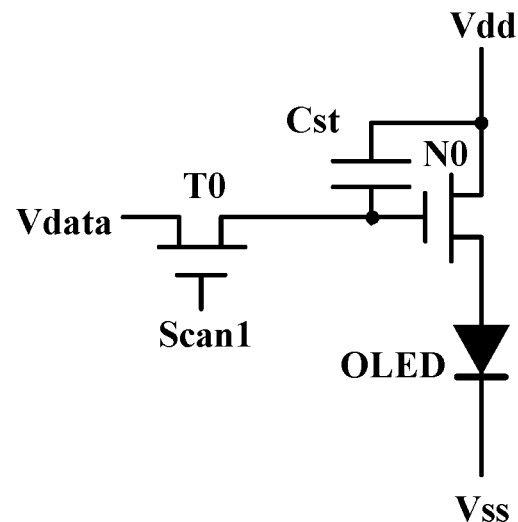
FIG. 1A is a schematic diagram of a pixel circuit.

A fundamental pixel circuit adopted by AMOLED display panels normally is a 2T1C type pixel circuit, which drives the OLED to emit light with two thin-film transistors (TFTs) and one storage capacitor Cst. FIG. 1A illustrates a schematic diagram of a 2T1C type pixel circuit, and FIG. 1B illustrates a schematic diagram of another 2T1C type pixel circuit.

As illustrated in FIG. 1A, a 2T1C type pixel circuit includes a switching transistor T0, a driving transistor N0 and a storage capacitor Cst. For example, a gate electrode of the switching transistor T0 is connected to a scan line so as to receive scan signals Scan1. For example, a source electrode of the switching transistor T0 is connected to a data line so as to receive data signal Vdata; and a drain electrode of the switching transistor T0 is connected to a gate electrode of the driving transistor N0. A source electrode of the driving transistor N0 is connected to a first voltage terminal so as to receive a first voltage Vdd (e.g., a high voltage), and a drain electrode of the driving transistor N0 is connected to a positive terminal of the OLED. A first terminal of the storage capacitor Cst is connected to the drain electrode of the switching transistor T0 and the gate electrode of the driving transistor N0, and a second terminal of the storage capacitor Cst is connected to the source electrode of the driving transistor N0 and the first voltage terminal. The negative terminal of the OLED is connected to a second voltage terminal so as to receive a second voltage Vss (e.g., a low voltage, which is, for example, a grounded voltage, and smaller than the high voltage). The 2T1C type pixel circuit adopts two TFTs and one storage capacitor Cst to control gray scales of the display operation of the pixel circuit. In a case that the scan signal Scan1 is applied through the scan line to turn on the switching transistor T0, a data driving circuit charges the storage capacitor Cst through the switching transistor T0 by the data signal Vdata sent over the signal line, so as to allow the data signal Vdata to be stored into the storage capacitor Cst, and the stored data voltages Vdata control the conducting degree of the driving transistor N0, so as to control the value of the current, which is flowing through the driving transistor and used for driving the OLED to emit light, that is, the above-mentioned current determines the gray scale of the emitted light of the pixel circuit. In the 2T1C type pixel circuit as illustrated in FIG. 1A, the switching transistor T0 is an N type transistor and the driving transistor N0 is a P type transistor.

Figure 1B:
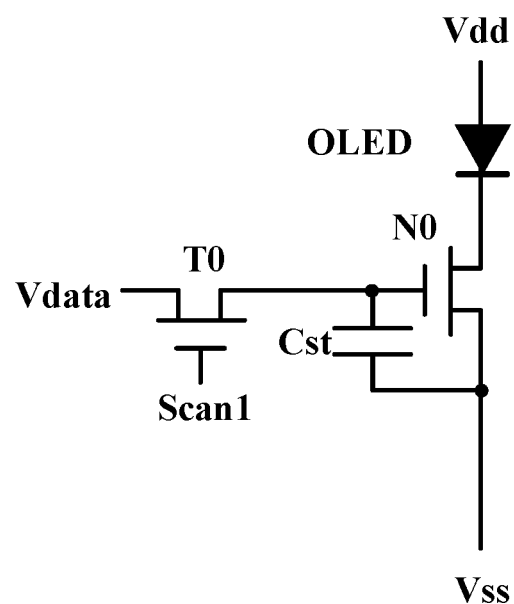
FIG. 1B is a schematic diagram of another pixel circuit.

As illustrated in FIG. 1B, another 2T1C type pixel circuit also includes the switching transistor T0, the driving transistor N0 and the storage capacitor Cst, but the connections are changed accordingly, and the driving transistor N0 is an N type transistor. Compare to the pixel circuit as illustrated in FIG. 1A, the pixel circuit, as illustrated in FIG. 1B, includes the following differences: the positive terminal of the OLED is connected to the first voltage terminal so as to receive the first voltage Vdd (the high voltage), while the negative terminal of the OLED is connected to the drain electrode of the driving transistor N0, the source electrode of the driving transistor N0 is connected to the second voltage terminal so as to receive the second voltage Vss (the low voltage, for example, the grounded voltage). The first terminal of the storage capacitor Cst is connected to the drain electrode of the switching transistor T0 and the gate electrode of the driving transistor N0, and the second terminal of the storage capacitor Cst is connected to the source electrode of the driving transistor N0 and the second voltage terminal. The operation mechanism of the 2T1C type pixel circuit as illustrated in FIG. 1B is similar to the operation mechanism of the 2T1C type pixel circuit as illustrated in FIG. 1A, and no further descriptions will be given here.

Furthermore, for the pixel circuits as illustrated in FIG. 1A and FIG. 1B, the switching transistor T0 is not limited to adopt an N type transistor, and a P type transistor can also be adopted. In this case, the polarity (for example, high voltage level or low voltage level) of the scan signals Scan1, which is used for turning on or turning off the driving transistor N0, provided by a scan control terminal can be changed accordingly.

The OLED display panels generally include a plurality of pixel units that are arrayed (arranged in an array), and each of the pixel units, for example, can include the above-mentioned pixel circuit. In the OLED display panels, threshold voltages of the driving transistors in the plurality of pixel units can be different from each other because of the manufacturing processes. Furthermore, because of, for example, the influence of temperature variation or fluctuation, the threshold voltages of the driving transistors can be shifted. Because the difference between the threshold voltages of the driving transistors can cause display defects (for example, display inhomogeneity), compensation of the threshold voltage is needed.

For example, after the data signal Vdata (for example, the data voltage) is applied to the gate electrode of the driving transistor N0 through the switching transistor T0, the data signal Vdata can charge the storage capacitor Cst, and the driving transistor N0 can be turned on because of the data signal Vdata. The voltage Vs of the source electrode or the drain electrode of the driving transistor N0 can be changed accordingly, in which the source electrode or the drain electrode is connected to the first terminal of the storage capacitor Cst.

Figure 1C:
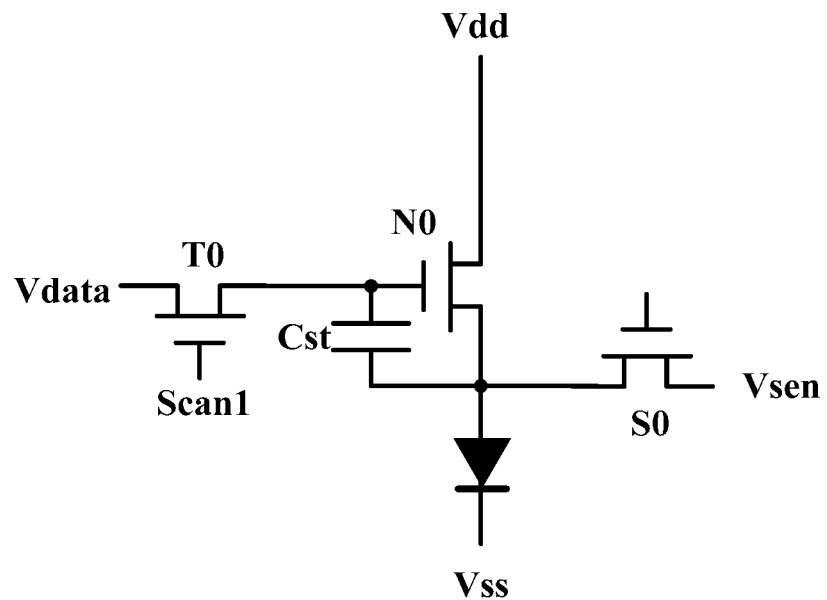
FIG. 1C is a schematic diagram of further another pixel circuit.

For example, FIG. 1C illustrates a pixel circuit (i.e., a 3T1C type pixel circuit) able to detect the threshold voltage of the driving transistor, and the driving transistor N0 is an N type transistor. For example, as illustrated in FIG. 1C, in order to realize the compensation function, a sensing transistor S0 can be introduced on the basis of the above-mentioned 2T1C type pixel circuit, that is, a first terminal of the sensing transistor S0 can be connected to the source electrode of the driving transistor N0, a second terminal of the sensing transistor S0 is connected to the sensing line and the detection circuit (not illustrated in figures), such that discharge toward the detection circuit via the sensing transistor S0 can be carried out after the driving transistor N0 is in conduction state, so as to allow the electric potential of the source electrode of the driving transistor N0 to be changed. In the case that the voltage Vs of the source electrode of the driving transistor N0 is equal to the difference between the voltage Vg of the gate electrode of the driving transistor N0 and the threshold voltage Vth of the driving transistor N0, the driving transistor N0 is in cut-off state. In this case, a cut-off source electrode voltage (i.e., the source electrode voltage Vb after the driving transistor N0 is in cut-off state) can be obtained from the source electrode of the driving transistor N0 via the sensing transistor S0, which is in conduction state, after the driving transistor N0 is in cut-off state. The threshold voltage (i.e., Vth=Vdata−Vb) of the driving transistor can be obtained after the cut-off source electrode voltage of the driving transistor N0 in cut-off state is obtained. Therefore, a compensation value of each pixel circuit can be established (i.e., determined) based on the threshold voltage of the driving transistor in each pixel circuit, and compensating of the threshold voltage of each pixel circuit of the display panel can be realized with the above-mentioned compensation value.

Figure 1D:
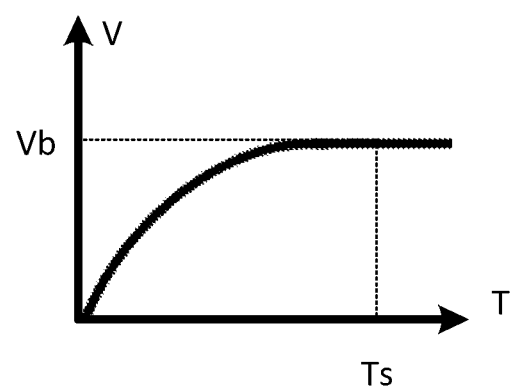
FIG. 1D is a schematic diagram illustrating a change of a sensed voltage over time.

For example, FIG. 1D illustrates the change of the source electrode voltage, which is obtained from the source electrode of the driving transistor N0 via the sensing transistor S0 in conduction state, over time. During a detection process, the switching transistor T0 is maintained to be in conduction state, such that the voltage Vg of the gate electrode of the driving transistor N0 is maintained to be Vdata. The inventors of present disclosure note that, in the process of discharging toward the detection circuit via the sensing line, the charging speed is gradually decreased (i.e., the speed for increasing the sensed voltage is decreased) along with the lapse of the time of charging the storage capacitor Cst, after the data signal Vdata is applied (see FIG. 1D). This is because a charging current is gradually decreased along with an increase of the source electrode voltage (i.e., the voltage Vs of the source electrode of the driving transistor N0). Specifically, the current Ids outputted by the driving transistor N0 in the saturation state can be obtained by the follow equations:

$$Ids = \tfrac{1}{2} \times K (Vg - Vs - Vth)^2 =$$

$$\tfrac{1}{2} \times K (Vdata - Vs - Vth)^2 =$$

$$\tfrac{1}{2} \times K ((Vdata - Vth) - Vs)^2.$$

where $K = W/L \times C \times \mu$, W/L is the width-to-length ratio (i.e., the ratio between the width and the length) of a channel of the driving transistor N0, $\mu$ is the electron mobility, and C is the capacitance of unit area.

During the process that the voltage Vs of the source electrode of the driving transistor N0 is increased to Vdata−Vth, the vaule of [(Vdata−Vth)−Vs] continues to decrease along with the increase of Vs; correspondingly, the current Ids outputted by the driving transistor N0 and the charging speed continues to decrease. Therefore, the time Ts between the start time point of charging and the cut-off time point of the driving transistor N0 is relatively long.

Furthermore, the inventors further note that the difference, which is caused by the manufacturing process, between the threshold voltages Vth of the driving transistors of the pixel circuits in the display panel is relatively large, in order to guarantee that the driving transistors of the pixel circuits in the display panel can be in conduction state, the amplitude of the data signal Vdata, which are used for detection, is required to be relatively large; correspondingly, the cut-off source electrode voltage Vb=Vdata−Vth of the driving transistor N0 in cut-off state is relatively large; in this case, the time Ts required for allowing the driving transistor N0 to be in cut-off state is further increased, otherwise, the measurement result is inaccurate and the compensation effect is degraded in the case the sensed voltage is measured before the driving transistor N0 is in cut-off state.

At least because the above-mentioned reasons, current threshold voltage detection is normally performed during the shutting down processes of display panels, in which the shutting down process is a time period after the normal display process of the display panel is finished and before the display panel is completely shut down, and the threshold voltage detection of the driving transistor N0 cannot be performed during the display panel is turned on (for example, during a time period between adjacent display periods of the display process). Therefore, real-time monitoring and compensation cannot be realized in the display process, and thus the compensation result and the luminance uniformity of the display panel are decreased.

The embodiments of the present disclosure provides a detection method for a pixel circuit, a driving method for a display panel and a display panel, the detection method can decrease the time required for detecting the threshold, such that the threshold detection of the pixel circuit can be performed when the display panel is turned on, this improves the threshold compensation result and increases the luminance uniformity of the display panel including the pixel circuit.

At least one embodiment of the present disclosure provides a detection method for a pixel circuit, the pixel circuit includes a driving transistor, the driving transistor includes a gate electrode and a first terminal, the first terminal of the driving transistor is electrically connected to a sensing line. The detection method includes: applying a data voltage and a setting voltage to the driving transistor so as to obtain a sensed voltage, and obtaining a threshold voltage of the driving transistor based on the data voltage, the setting voltage and the sensed voltage. The data voltage and the setting voltage are respectively applied to the gate electrode and the first terminal of the driving transistor so as to set the driving transistor to be in a saturation region; the gate electrode of the driving transistor is set to be in a suspension state when the driving transistor is maintained in the saturation region, and the sensed voltage is obtained through the sensing line after a pre-determined time period.

Non-limitive descriptions are given to the detection method for the pixel circuit provided by the embodiments of the present disclosure in the following with reference to a plurality of examples. As described in the following, in case of no conflict, different features in these specific examples can be combined so as to obtain new examples, and the new examples are also fall within the scope of present disclosure.

Figure 2:
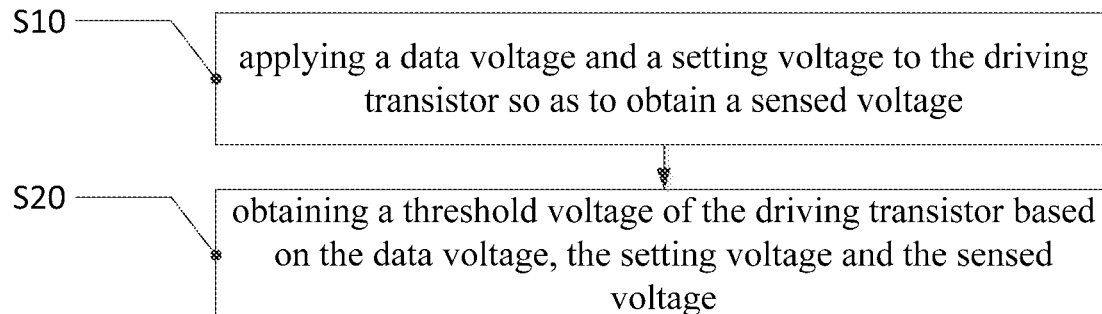
FIG. 2 is an exemplary flow chart of a detection method for a pixel circuit provided by at least one embodiment of the present disclosure.

FIG. 2 illustrates a detection method for a pixel circuit provided by an embodiment of the present disclosure, the detection method for the pixel circuit can detect the threshold voltage Vth of a driving transistor T3 of the pixel circuit. For example, exemplary descriptions are given below to the detection method for the pixel circuit provided by the embodiments of the present disclosure with reference to the pixel circuits illustrated in FIG. 3A and FIG. 3B, but the embodiments of the present disclosure are not limited to these cases.

Figure 3A:
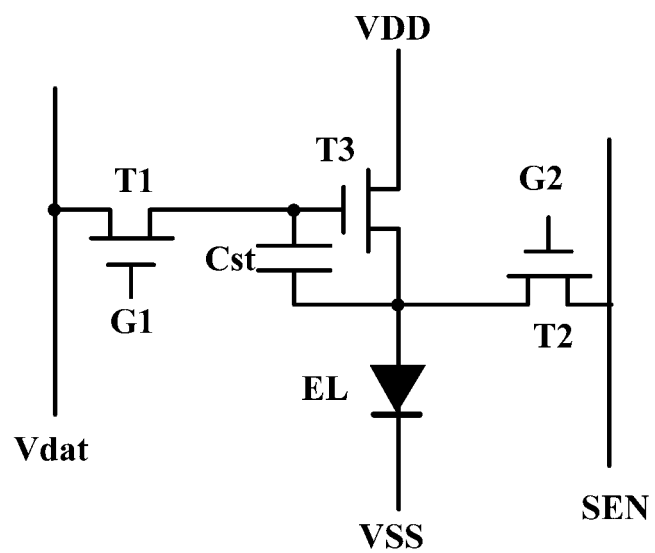
FIG. 3A is a schematic diagram of a pixel circuit provided by at least one embodiment of the present disclosure.

For example, as illustrated in FIG. 3A, the pixel circuit includes the driving transistor T3, and a light-emitting element EL and a sensing line SEN, which are electrically connected to a first terminal (or a second terminal) of the driving transistor. The driving transistor T3 includes a gate electrode and the first terminal, and is used for control the current flowing through the light-emitting element EL; the sensing line SEN is electrically connected to the first terminal of the driving transistor, a voltage of the first terminal of the driving transistor can be set via the sensing line SEN and a sensed voltage can be obtained via the sensing line SEN. The pixel circuit can apply a data voltage to the gate electrode of the driving transistor T3 and apply a setting voltage to the first terminal (for example, a source electrode) of the driving transistor T3, so as to control the state (for example, in turned on or in cut-off state) of the driving transistor T3, or control a driving current flowing through the driving transistor T3. For example, the detection method for the pixel circuit includes the following steps.

Step S10: applying a data voltage and a setting voltage to the driving transistor so as to obtain a sensed voltage.

Step S20: obtaining a threshold voltage of the driving transistor based on the data voltage, the setting voltage and the sensed voltage.

For example, in the step S10, the data voltage (for example, a first data voltage Vd1 or a second data voltage Vd2) and the setting voltage (for example, a first setting voltage Vset1 or a second setting voltage Vset2) are applied to the driving transistor T3 so as to obtain the sensed voltage (for example, a first sensed voltage Vvc1 or a second sensed voltage Vvc2). The above-mentioned operation includes: applying the data voltage and the setting voltage respectively on the gate electrode of the driving transistor T3 and the first terminal of the driving transistor T3 so as to set the driving transistor T3 in a saturation region (for example, in a deep saturation region); allowing the gate electrode of the driving transistor T3 to be in a suspension state while the driving transistor T3 is maintained at the saturation region (for example, the deep saturation region); and obtaining the sensed voltage via the sensing line SEN after a pre-determined time period.

For example, as illustrated in FIG. 3A, the pixel circuit further includes a first transistor T1 and a storage capacitor Cst. The first transistor T1 is configured to be an input switch, and a gate electrode, which is used as a control terminal G1, of the first transistor T1 is connected to a scan line so as to receive scan signals. A first terminal of the first transistor T1 is connected to a signal line Vdat so as to receive data signals, and the gate electrode of the driving transistor T3 is connected to a second terminal of the first transistor T1 such that the data signals received by the first transistor are applied to the gate electrode of the driving transistor T3. A first terminal of the storage capacitor Cst and a second terminal of the storage capacitor Cst are respectively connected to the gate electrode of the driving transistor T3 and the first terminal of the driving transistor T3, so as to allow the storage capacitor Cst to store the data signals.

Figure 3B:
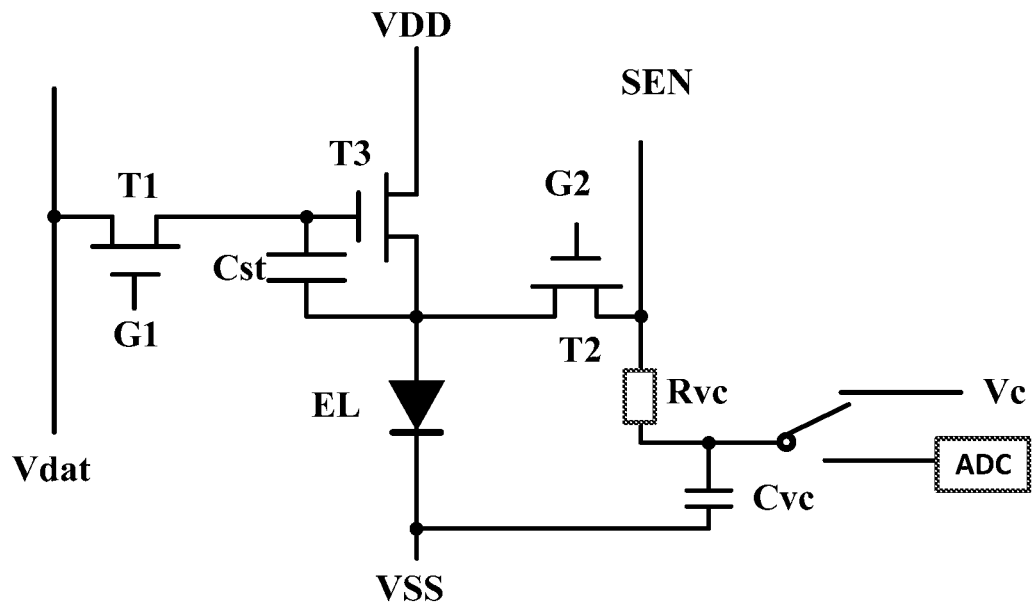
FIG. 3B is a schematic diagram of another pixel circuit provided by at least one embodiment of the present disclosure.

For example, as illustrated in FIG. 3A, the pixel circuit further includes a second transistor T2. The second transistor T2 is configured as a sensing switch, a first terminal of the second transistor T2 is connected to the first terminal of the driving transistor T3. A second terminal of the second transistor T2 is connected to the sensing line SEN, so as to allow the first terminal of the driving transistor to receive the setting voltage, to allow a capacitor related to or formed by the sensing line to be charged to form the sensed voltage, and to allow the sensed voltage to be detected via the sensing line. A gate electrode, which is used as a control terminal G2, of the second transistor T2 is connected to a sensing scan line so as to receive a sensing control signal. For example, according to specific implementation demands, the pixel circuit is further connected to a first power source terminal VDD and a second power source terminal VSS. For example, in the case that the sensing line SEN includes parasitic capacitance Cvc and resistance Rvc, the pixel circuit as illustrated in FIG. 3A can be equivalent to the pixel circuit as illustrated in FIG. 3B. The parasitic capacitance Cvc can be charged by the current originated from the driving transistor T3, such that the voltage corresponding to the sensing line SEN is changed, but the embodiments of the present disclosure are not limited to this case. In addition to use the parasitic capacitance Cvc on the sensing line SEN, a sensing capacitor can be additionally provided to assist to realize the detection method provided by the embodiments of the present disclosure. A first terminal of the sensing capacitor is connected to the sensing line SEN, and a second terminal of the sensing capacitor is connected to, for example, a constant voltage source (for example, the second terminal of the sensing capacitor is grounded).

In the above-mentioned embodiment as illustrated in FIG. 3A, the driving transistor T3 is an N type transistor, the first power source terminal VDD is a high voltage terminal, and the second power source terminal VSS is a low voltage terminal, in which a voltage outputted by the low voltage terminal is smaller than a voltage outputted by the high voltage terminal, and the low voltage terminal is, for example, grounded. Correspondingly, the first terminal of the driving transistor T3 is a source electrode and is connected to the light-emitting element EL. Furthermore, the first transistor T1 and the second transistor T2 are also N type transistors.

In operation, for example, the data voltage provided by the signal line Vdat is applied to the gate electrode of the driving transistor T3 by turning on the first transistor T1 (for example, applying a signal with a high voltage level to the control terminal G1 of the first transistor T1); the setting voltage can be applied to the first terminal of the driving transistor T3 by turning on the second transistor T2 (for example, applying a signal with a high voltage level to the control terminal G2 of the second transistor T2). For example, the setting voltage can be provided by a setting power source terminal Vc as illustrated in FIG. 3B, so as to allow the gate-source voltage (difference) (Vgs) of the driving transistor T3 is larger than the threshold voltage Vth of the driving transistor T3 and allow the drain-source voltage (Vds, that is, the difference between the voltage of a second terminal of a thin film transistor and the voltage of a first terminal of the thin film transistor) of the driving transistor T3 is larger than the difference between the gate-source voltage and the threshold voltage (i.e., Vds>Vgs−Vth), that is, 0<Vgs−Vth<Vds, and therefore, the driving transistor T3 can be set in the saturation region. For example, Vds can be in the range of 12V-36V (for example, 24V), but the embodiments of the present disclosure are not limited to this case.

For example, in conventional threshold voltage detection technologies, in order to minimize the detection time of the threshold voltage, the thin film transistor is normally set to be in a sub-threshold region, this is because in the case that the thin film transistor is set to be in the deep saturation region, the thin film transistor has to change from the deep saturation region to the sub-threshold region, and in this case, the time required for detecting the threshold voltage is correspondingly increased. In the case that the thin film transistor is set to be in the sub-threshold region, the gate-source voltage Vgs and the threshold voltage Vth of the thin film transistor satisfy the following equation: Vgs−Vth≈Vpr (in which Vpr can be, for example, 2V or 3V), in this case, the voltage difference Vgs between the voltage of the gate of the thin film transistor and the voltage of a first terminal of the thin film transistor is slightly larger than the threshold voltage Vth of the thin film transistor; correspondingly, the charging current is quite small. Therefore, compared with the conventional technologies, in which the driving transistor T3 is set in the sub-threshold region, the embodiments of the present disclosure set the driving transistor T3 in the saturation region, and therefore the parasitic capacitance related to the sensing line SEN can be charged with a larger current Ids, such that the charge speed can be increased and the time required for detecting the threshold can be decreased.

For an N type transistor, in the case that the transistor is in the saturation region, the current flowing through the transistor is increased along with the increase of the gate-source voltage Vgs of the transistor, and the larger current is in favor of detection. For example, in the present embodiment, according to specific implementation demands, the driving transistor T3 can be set in the deep saturation region. It should be noted that "the deep saturation region" in the embodiments of the present disclosure refers to such a region, which is closer to the liner region in a transfer characteristic curve of the thin film transistor, of the saturation region in the transfer characteristic curve, in which the difference between Vgs−Vth (here Vgs is the voltage difference between the gate electrode voltage of the thin film transistor and the voltage of the first terminal of the thin film transistor) is smaller than and close to the voltage difference Vds. For example, in order to set the thin film transistor to be in the deep saturation region, the gate-source voltage Vgs, the drain-source voltage Vds, and the threshold voltage Vth of the thin film transistor can satisfy the following equation: 0<Vds−Vgs+Vth<Vpreset, and thus Vds−Vpreset<Vgs−Vth<Vds. For example, Vds can be in the range of 12V-36V (for example, 24V), Vpreset can be in the range of 1V-4V (for example, 2V or 3V), but the embodiments of the present disclosure are not limited to this case. For example, because Vgs−Vth (for example, larger than Vds−Vpreset=22V), when the thin film transistor in the deep saturation region, is significantly larger than Vgs−Vth (for example, is approximately equal to Vpr=2V), when the thin film transistor in the sub-threshold region. Therefore, the threshold detection method provided by the embodiments of the present disclosure can charge the capacitor with a larger current Ids, and thus the charging speed can be further increased and the time required for subsequent detection can be further reduced. Because the time required for detection is relatively short, the detection of the threshold characteristics of the pixel circuit can be performed during the time period that the display panel is turned on, and thus the compensation result can be improved and the luminance uniformity of the display panel including the pixel circuit can be increased.

For example, the gate electrode of the driving transistor T3 can be set in a suspension state by turning off the first transistor T1 (for example, by applying a signal with a low voltage level to the first transistor T1). Because the gate electrode of the driving transistor T3 is in a suspension state, electric charges stored in the storage capacitor Cst cannot be changed suddenly through releasing or charging (i.e., the quantity of electric charges stored in the storage capacitor Cst is remain unchanged); correspondingly, according to the charge conservation principle of the capacitor, the voltage difference between two terminals of the storage capacitor Cst also remains unchanged, that is, the voltage difference between the gate electrode of the driving transistor T3 and the first terminal of the driving transistor T3 is maintained as the difference between the data voltage and the setting voltage, and therefore the voltage of the gate electrode of the driving transistor T3 is changed along with the source electrode voltage of the driving transistor T3. Therefore, the driving transistor T3 is maintained at the saturation region, and the value of the current Ids remains unchanged. For example, the parasitic capacitor Cvc on the sensing line SEN can be charged by the current Ids with a constant and large value by allowing the gate electrode of the driving transistor T3 to be in the suspension state, and therefore the charging speed of the parasitic capacitance Cvc can be further increased, and the time required for subsequent sensed voltage detection can be further decreased.

For example, as illustrated in FIG. 3B, after the pre-determined time period (for example, a pre-determined time period T after the first transistor T1 is turned off), the sensed voltage, which is formed by the parasitic capacitance Cvc, can be obtained through the sensing line SEN. For example, during the process of acquiring the sensed voltage through the sensing line SEN, the second transistor T2 can be turned off. By turning off the second transistor T2, further increasement of the sensed voltage in a read phase can be prevented, and sufficient time can be reserved for reading the sensed voltage, so as to increase the accuracy of the sensed voltage obtained from the sensing line SEN. For example, as illustrated in FIG. 3B, the sensing line SEN can be electrically connected to an analog-to-digital converter ADC, so as to transform an analog signal of the sensed voltage obtained via the sensing line SEN into a digital signal.

For example, the threshold voltage Vth of the driving transistor T3 can be obtained based on the data voltage, the setting voltage and the sensed voltage. For example, the current Ids outputted by the driving transistor T3 in the saturation region can be obtained through the following equation:

$$Ids=k(Vgs-Vth)^2.$$

where $k=\frac{1}{2}\times K=\frac{1}{2}\times W/L\times C\times \mu$, W/L is the width-to-length ratio (i.e., the ratio between the width and the length) of a channel of the driving transistor T3, $\mu$ is the electron mobility, and C is the capacitance of unit area.

For example, the time T between the turn-off time of the first transistor T1 and the turn-off time of the second transistor T2 (i.e., the charging time is T), the parasitic capacitance Cvc, the sensed voltage Vvc obtained through the sensing line SEN, the current Ids and the charging time T satisfy the following equation:

$$Cvc\times Vvc=Ids\times T=k\times (Vgs-Vth)^2\times T$$

Further, the following equations can be sequentially obtained from the above-mentioned equation:

$$(Vgs-Vth)^2=Vvc\times Cvc/(k\times T)=Vvc\times u^2, \text{ and } Vgs-Vth=\mu\times\sqrt{Vvc}.$$

where $u=\sqrt{Cvc/(k\times T)}$. Therefore, the voltage difference Vgs between the voltage of the gate electrode voltage of the thin film transistor and the voltage of the first terminal of the thin film transistor can be obtained based on the data voltage and the setting voltage, and the threshold voltage Vth can be obtained based on the sensed voltage Vvc of the driving transistor T3 and the voltage difference Vgs.

For example, during obtaining of the sensed voltage through applying the data voltage and the setting voltage on the driving transistor T3, a plurality of detection operations can be preformed, for example, two detection operations can be preformed to obtain the sensed voltage. An example that the sensed voltage is obtained by performing two continued detection operations can includes the following steps, and the example that the sensed voltage is obtained by performing two detection operations is described in the following with reference to FIG. 4-FIG. 6.

Step S101: performing a first detection operation, and applying a first data voltage Vd1 and a first setting voltage Vset1 to the driving transistor T3 so as to obtain a first sensed voltage Vvc1.

Figure 4:
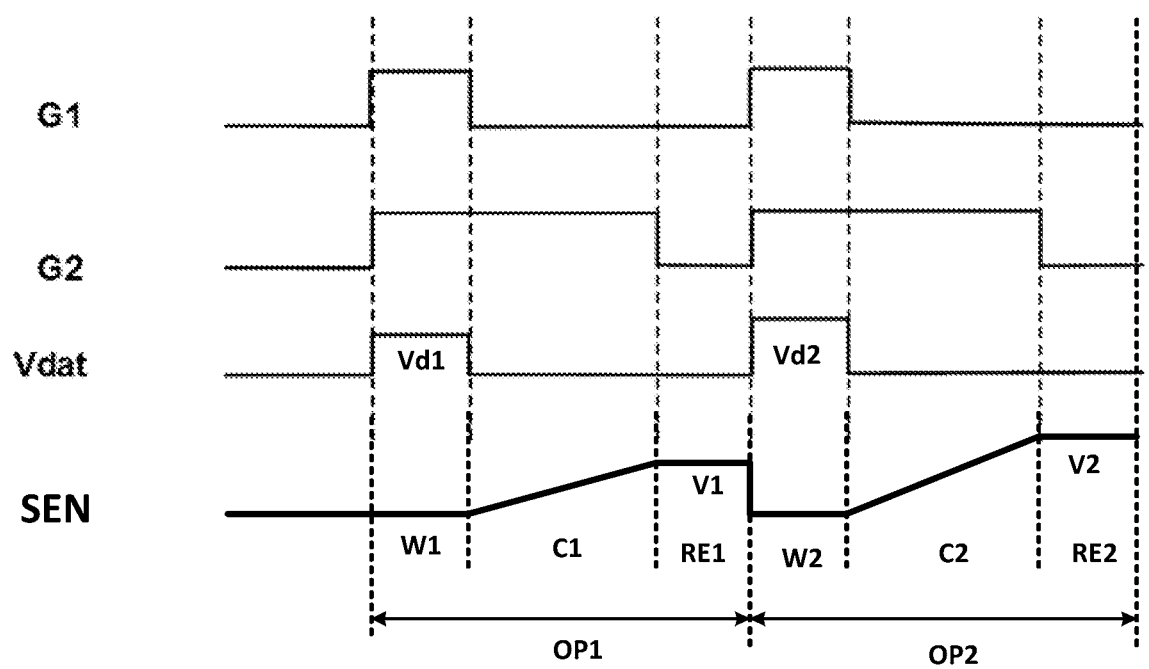
FIG. 4 is a schematic diagram illustrating a timing diagram of the pixel circuit as illustrated in FIG. 3A and a change of a voltage in a sensing line over time.

Step S102: performing a second detection operation, and applying a second data voltage Vd2 and a second setting voltage Vset2 to the driving transistor T3 so as to obtain a second sensed voltage Vvc2; and For example, as illustrated in FIG. 4, during a first writing phase W1 of the first detection operation OP1, the first transistor T1 and the second transistor T2 are turned on, such that the first data voltage Vd1 provided by the signal line Vdat can be applied to the gate electrode of the driving transistor T3, and the first setting voltage Vset1 provided by the setting power source terminal Vc can be applied to the first terminal of the driving transistor T3, and the voltage difference Vgs between the gate electrode of the driving transistor T3 and the first terminal of the driving transistor T3 can be set to be equal to the difference between the first data voltage Vd1 and the first setting voltage Vset1. For example, the first data voltage Vd1 and the first setting voltage Vset1 are configured to allow the driving transistor T3 to set in, for example, the deep saturation region, but the embodiments of the present disclosure are not limited to this case.

For example, as illustrated in FIG. 4, after the first data voltage Vd1 is written into the gate electrode of the driving transistor T3 and the first setting voltage Vset1 is written into the first terminal of the driving transistor T3, the first transistor T1 can be turned off, such that the gate electrode of the driving transistor T3 is set to be in the suspension state, and the voltage difference Vgs between the gate electrode of the driving transistor T3 and the first terminal of the driving transistor T3 is maintained to be equal to the voltage difference Vd1-Vset1 between the first data voltage Vd1 and the first setting voltage Vset1, so as to keep the driving transistor T3 in the deep saturation region.

For example, as illustrated in FIG. 4, after a first pre-determined time period T1 (i.e., the time length of a first charging phase C1 is T1), the second transistor T2 is turned off and the first transistor T1 is maintained to be turned off during a first read phase RE1 of the first detection operation OP1, such that the first sensed voltage Vvc1 can be obtained via the sensing line SEN.

For example, as illustrated in FIG. 4, after the first detection operation OP1, the first transistor T1 and the second transistor T2 are turned on during a second writing phase W2 of the second detection operation OP2, such that the second data voltage Vd2 provided by the signal line Vdat can be applied to the gate electrode of the driving transistor T3, and the second setting voltage Vset2 provided by the setting power source terminal Vc can be applied to the first terminal of the driving transistor T3, and the voltage difference of Vgs between the gate electrode of the driving transistor T3 and the first terminal of the driving transistor T3 can be set to be equal to the difference Vd2−Vset2 between the second data voltage Vd2 and the second setting voltage. For example, the second data voltage Vd2 and the second setting voltage Vset2 are used to allow the driving transistor T3 to be set in, for example, the deep saturation region, but the embodiments of the present disclosure are not limited to this case.

For example, as illustrated in FIG. 4, after the second data voltage Vd2 is written into the gate electrode of the driving transistor T3 and the second setting voltage Vset2 is written into the first terminal of the driving transistor T3, the first transistor T1 can be turned off, so as to set the gate electrode of the driving transistor T3 to be in a suspension state, and to maintain the voltage difference Vgs between the gate electrode of the driving transistor T3 and the first terminal of the driving transistor T3 to be equal to the difference Vd2−Vset2 between the second data voltage Vd2 and the second setting voltage Vset2, such that the driving transistor T3 can be maintained in, for example, the deep saturation region.

For example, as illustrated in FIG. 4, after a second pre-determined time period T2 (i.e., the time length of a second charging phase C2 is T2), the second transistor T2 is turned off, and the first transistor T1 is maintained to be turned off in a second read phase RE2 of the second detection operation OP2, and therefore, the second sensed voltage Vvc2 can be obtained through the sensing line SEN.

For example, the equation illustrating the relationship between the parameter u and the threshold voltage Vth at any time can be obtained through setting the first detection operation OP1 and the second detection operation OP2, and therefore, the threshold voltage Vth can be calculated by the equation without the parameter u, such that the error caused by, for example, the mobility variation can be avoided, and the accuracy of the detection result can be further improved.

For example, as illustrated in FIG. 4, the second data voltage Vd2 can be not equal to the first data voltage Vd1. For example, the second data voltage Vd2 can be larger than the first data voltage Vd1, but the embodiments of the present disclosure are not limited to this case. For another example, according to specific implementation demands, the second data voltage Vd2 can also be smaller than the first data voltage Vd1. For example, as illustrated in FIG. 4, the first setting voltage Vset1 can be equal to the second setting voltage Vset2, such that the data calculation amount can be reduced. For example, both the first setting voltage Vset1 and the second setting voltage Vset2 can be equal to zero, but the embodiments of the present disclosure are not limited to this case. For example, in the first charging phase C1 and the first charging phase C2, the setting power source terminal Vc can be in a suspension state.

By performing the above-mentioned first detection operation OP1 and second detection operation OP2, the threshold voltage Vth of the driving transistor T3 can be obtained based on the first data voltage Vd1, the second data voltage Vd2, the first setting voltage Vset1 and the second setting voltage Vset2. For example, the first data voltage Vd1, the second data voltage Vd2, the first setting voltage Vset1, the second setting voltage Vset2, the time length T1 of the first charging phase C1 (i.e., the length of the pre-determined time period of the first detection operation) and the time length T2 of the second charging phase C2 (i.e., the length of the pre-determined time period of the second detection operation) satisfy the following equation.

$$\frac{Vgs2 - Vth}{Vgs1 - Vth} =$$

$$\frac{u2}{u1} \times \sqrt{\frac{Vvc2}{Vvc1}} = \sqrt{\frac{T2}{T1}} \sqrt{\frac{Vvc2}{Vvc1}} = \sqrt{x} \sqrt{Vvc2/Vvc1}.$$

where x=T2/T1, and the following equations can be sequentially obtained according to the above-mentioned equation.

$$Vth(1-\sqrt{Vvc2/Vvc1})=Vgs2-\sqrt{x}\sqrt{Vvc2/Vvc1}\times Vgs1$$

$$Vth = \frac{Vgs2 - \sqrt{x}\sqrt{Vvc2/Vvc1} \times Vgs1}{1 - \sqrt{x}\sqrt{Vvc2/Vvc1}}.$$

For example, the time length of the first pre-determined time period of the first detection operation and the time length of the second pre-determined time period of the second detection operation can be same (in this case, x=1), and the threshold voltage of the driving transistor T3 can be obtained through the following equation:

$$Vth = \frac{Vgs1 - Vgs2\sqrt{Vvc2/Vvc1}}{1 - \sqrt{Vvc2/Vvc1}}.$$

Therefore, the threshold voltage Vth of the driving transistor T3 can be obtained based on the first data voltage Vd1, the second data voltage Vd2, the first setting voltage Vset1 and the second setting voltage Vset2.

Figure 5:
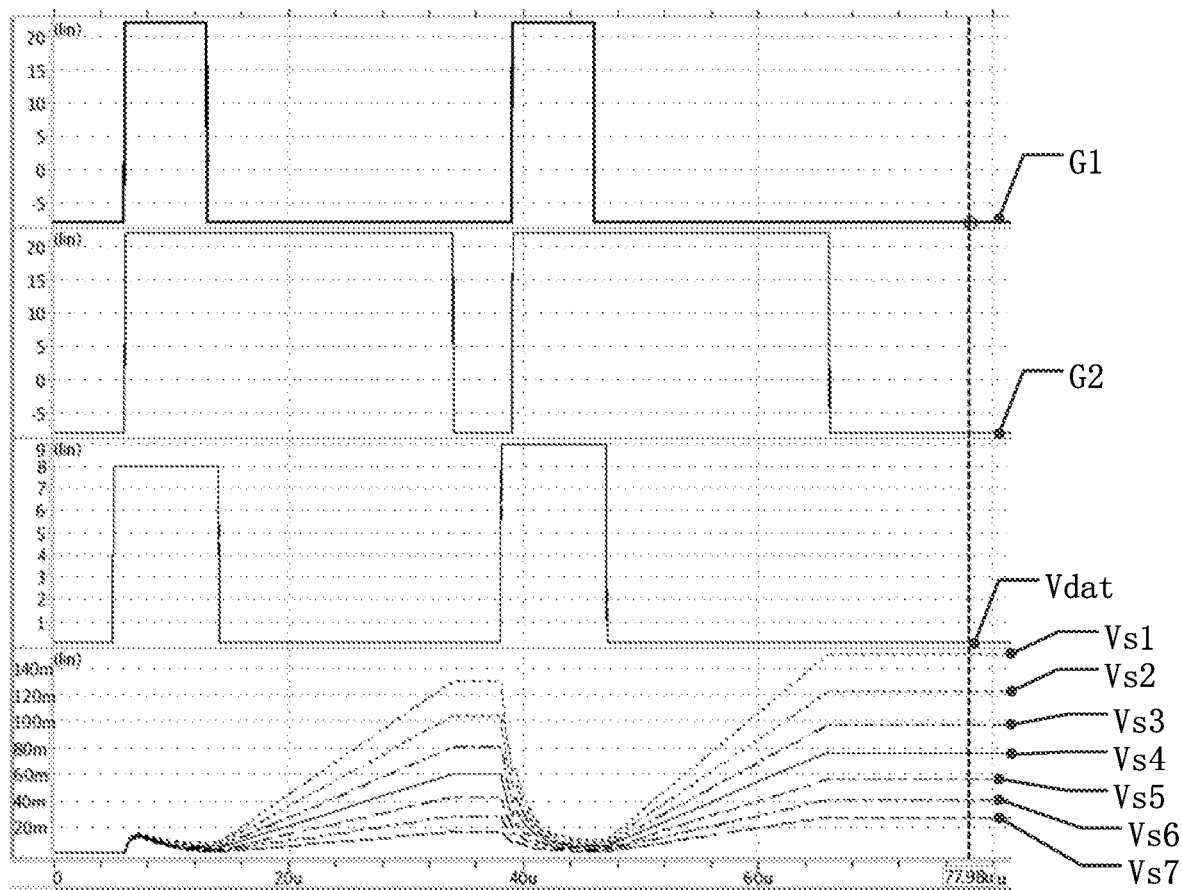
FIG. 5 is a schematic diagram illustrating a simulation result of threshold detection of a driving transistor.
Figure 6:
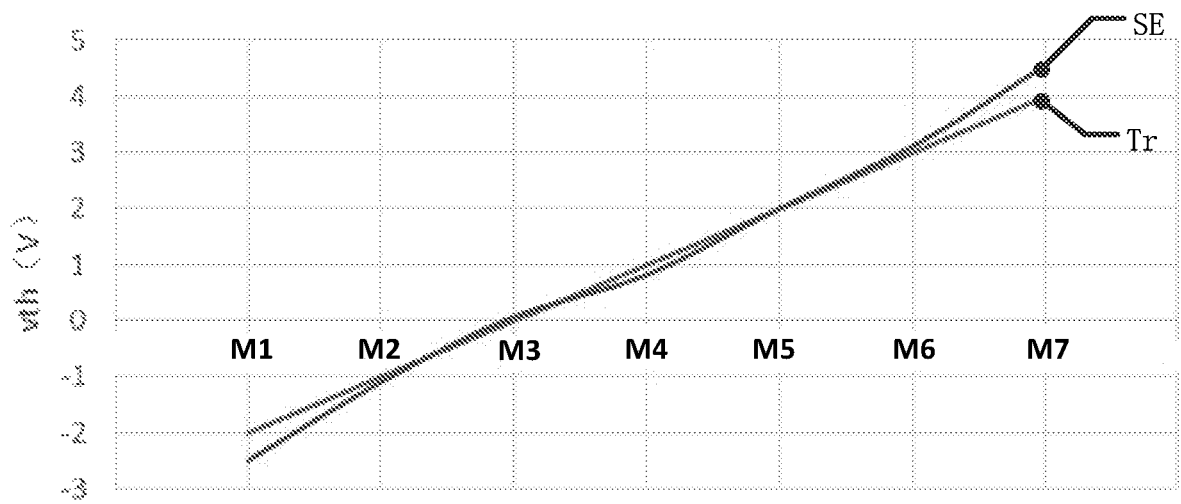
FIG. 6 is a schematic diagram illustrating a comparison result of an actual threshold value and a detected threshold value of a driving transistor.
Figure 7:
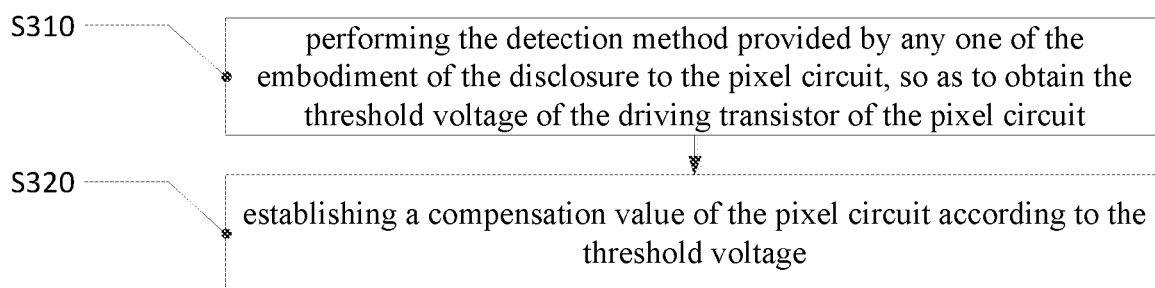
FIG. 7 is an exemplary flow chart of a driving method for a display panel provided by at least one embodiment of the present disclosure.

For example, FIG. 5 and FIG. 6 illustrate the simulation result of the threshold detection of the driving transistor T3 with seven different thresholds. For example, FIG. 5 illustrates a timing diagram of the control terminal G1 of the first transistor T1, the control terminal G2 of the second transistor T2 and the signal line Vdat in the first detection operation and the second detection operation. FIG. 5 also illustrates curves Vs1, Vs2, Vs3, Vs4, Vs5, Vs6 and Vs7 respectively illustrating the change of the voltage of a first terminal of a driving transistor M1, a driving transistor M2, a driving transistor M3, a driving transistor M4, a driving transistor M5, a driving transistor M6 and a driving transistor M7 over time. For example, FIG. 7 illustrates the comparison between an actual threshold voltage Tr of the driving transistor M1, the driving transistor M2, the driving transistor M3, the driving transistor M4, the driving transistor M5, the driving transistor M6 and the driving transistor M7 with the threshold voltage SE obtained through the detection method provided by the embodiments of the present disclosure. As illustrated in FIG. 7, the threshold voltage SE obtained by the embodiments of the present disclosure is consistent with the actual threshold voltage Tr.

It should be noted that, the symbol "lin" in FIG. 7 means that the coordinate axis is a linear coordinate axis, the symbol "m" in FIG. 7 represents millivolt (for example, "120 m" represents 120 millivolts), and "u" in FIG. 7 represents microsecond (for example, "60 u" represents 60 microseconds).

For example, as illustrated in FIG. 7, both the time required for the first detection operation and the time required for the second detection operation can be only tens of microseconds, and therefore, the detection method for the pixel circuit provided by the embodiments of the present disclosure can be performed in pre-determined time gaps between adjacent display periods.

For example, the display panel including the pixel circuit can include a plurality of display period, and the pre-determined time gap (time gap) can be set between adjacent display periods. For example, each display period is used for displaying a frame of image, and the time length of each display period is equal to the time period between the time for displaying a first image pixel of the frame of image and the time for displaying a last image pixel of the frame of image. For example, a blanking time can be provided between adjacent display periods, and the pre-determined time gap can be at least part of the blanking time. The first detection operation and the second detection operation can be performed in same one pre-determined time gap, such that the error caused by, for example, the mobility variation can be avoided, and the accuracy of the detection result can be further improved.

For example, the first detection operation and the second detection operation can be performed continuously, that is, the second writing phase W2 of the second detection operation OP2 and the first read phase RE1 of the first detection operation OP1 can be connected with each other in time, such that the error caused by, for example, the mobility variation can be further avoided, and the accuracy of the detection result can be further improved.

Figure 3C:
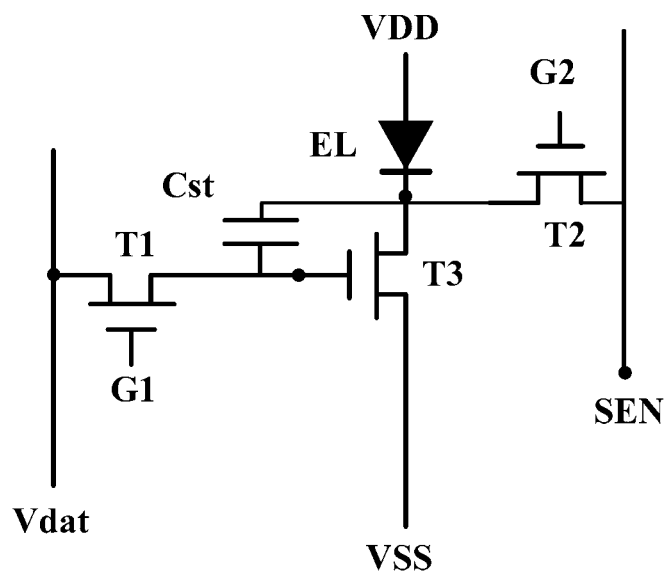
FIG. 3C is a schematic diagram of further another pixel circuit provided by at least one embodiment of the present disclosure.

For example, not only the detection method for the pixel circuit provided by the embodiments of the present disclosure can be used for detecting the threshold voltage of the driving transistor in the pixel circuits as illustrated in FIG. 3A and FIG. 3B, but also can be used for detecting the threshold voltage of the driving transistor in the pixel circuit as illustrated FIG. 3C.

The pixel circuit as illustrated in FIG. 3C also includes the driving transistor T3, and the light-emitting element EL and the sensing line SEN, which are electrically connected to the first terminal (or the second terminal) of the driving transistors. In the present examples, the driving transistor T3 is a P type transistor, the first power source terminal VDD is a high voltage terminal, the second power source terminal VSS is a low voltage terminal, in which a voltage outputted by the low voltage terminal is smaller than a voltage outputted by the high voltage terminal, and the low voltage terminal is for example grounded. Correspondingly, the first terminal of the driving transistor T3, which is configured as a source electrode, is connected to the light-emitting element EL. Furthermore, the first transistor T1 and the second transistor T2 can be N type transistors, or can be P type transistors. In order to turn on and turn off the transistor or control the driving current flowing through the driving transistor, corresponding control signals, data voltages or setting voltages or the like can be chosen according to the type of the driving transistor, and no further descriptions will be given here.

It should be noted that, although the detection method for the pixel circuit provided by the embodiments of the present disclosure is described by taking the case that the pixel circuit is a 3T1C type pixel circuit as an example, but the detection method provided by the embodiments of the present disclosure is not limited to be used in 3T1C type pixel circuits, for example, according to specific implementation demands, the detection method provided by the embodiments of the present disclosure can also be applied to, for example, 4T1C type pixel circuits, 4T2C type pixel circuits, 6T1C type pixel circuits, and other pixel circuits with electrical compensation function, and no further descriptions will be given here.

It should be noted that the transistors adopted in the embodiments of the present disclosure can be thin film transistors or field-effect transistors or other switching devices with similar characteristics. A source electrode and a drain electrode of the adopted transistor can be symmetrical in structure, and therefore, there can be no difference in the structures of the source electrode and the drain electrode of the transistor. In the embodiments of present disclosure, in order to distinguish two terminals of the transistors other than a gate electrode, which used as a control terminal, one terminal of the two terminals is denoted as a first terminal, and the other terminal of the two terminals is denoted as a second terminal, and therefore, the first terminal and the second terminal of all of or part of the transistors in the embodiment of present disclosure can be interchangeable when required. For example, the first terminal of the transistor in the embodiment of present disclosure can be a source electrode, and the second terminal of the transistor can be a drain electrode; alternatively, the first terminal of the transistor can be a drain electrode, and the second terminal of the transistor can be a source electrode.

Furthermore, the transistors can be divided into N type transistors and P type transistors according to the characteristics of the transistors, for the sake of clarity, the exemplary technical solution is described in detail by taking the case that the transistors in the above-mentioned embodiments of the present disclosure are N type transistors as an example, but the transistors in the embodiments of the present disclosure are not limited to adopt N type transistors, and one or more transistors of the embodiments of the present disclosure can be implemented as P type transistors when required, these transistors are, for example, thin film transistors.

For example, the detection method provided by the embodiments of the present disclosure can decrease the time required for detecting the threshold, such that the threshold detection of the pixel circuit can be performed during the display panel is turned on, this improves the threshold compensation result and increases the luminance uniformity of the display panel including the pixel circuit.

At least one embodiment of the present disclosure further provides a driving method for a display panel, the display panel comprises a pixel circuit and a sensing line, the pixel circuit comprises a driving transistor, the driving transistor comprises a gate electrode and a first terminal, the first terminal of the driving transistor is electrically connected to the sensing line, the driving method comprises: performing the detection method provided by any one of the embodiments of the present disclosure to the pixel circuit, so as to obtain the threshold voltage of the driving transistor of the pixel circuit.

For example, the display panel includes a plurality of the pixel units, and each of the pixel units can include a pixel circuit. The pixel units included by the display panel, for example, can be arrayed, i.e., arranged in an array; correspondingly, the pixel circuits, for example, can be arrayed. For example, the pixel circuits included by the display panel can be implemented as the pixel circuits as illustrated in FIG. 3A-FIG. 3C. For example, as illustrated in FIG. 7, the driving method for the display panel provided by the present disclosure includes the following step S310.

Step S310: performing the detection method provided by any one of the embodiments of the present disclosure to the pixel circuit, so as to obtain the threshold voltage of the driving transistor of the pixel circuit.

For example, the detection method for the pixel circuit can refer to the embodiment as illustrated in FIG. 2, and no further descriptions will be given here. For example, according to specific implementation demands, the driving method for the display panel provided by the present embodiment further includes the following step S320.

Step S320: establishing a compensation value of the pixel circuit according to the threshold voltage.

For example, in one example, firstly, the threshold voltages of the driving transistors of the pixel circuits can be detected row by row; secondly, the compensation value can be established with respect to every pixel circuit after the threshold voltages of the driving transistors of all the pixel circuits of the display panel are obtained; lastly, performing threshold compensation to the display panel based on the compensation values established. These compensation values can be stored in form of a look-up table, which is in favor of accessing and updating.

For example, firstly, the detection method for the pixel circuit provided by anyone of the embodiments of present disclosure can be performed with respect to the pixel circuits in a first row, and the threshold voltages of the driving transistors of the pixel circuits in the first row are obtained; secondly, the detection method for the pixel circuit provided by anyone of the embodiments of present disclosure can be performed with respect to the pixel circuits in a second row, and the threshold voltages of the driving transistors of the pixel circuits in the second row are obtained; next, the pixel circuits in other rows of the display panel can be detected row by row until the threshold voltages of the driving transistors of all the pixel circuits in the display panel are obtained; lastly, the compensation value is established with respect to every pixel circuit and the threshold compensation is performed with respect to the display panel.

For example, in another example, according to specific implementation demands, the threshold compensation also can be performed by adopting the following method: after detecting and obtaining the threshold voltages of the driving transistors of pixel circuits in a row, establishing the compensation values with respect to every pixel circuit in the row, and then performing threshold compensation with respect to the pixel circuits in the row. For example, firstly, the threshold detection, the compensation value establishment, and the threshold compensation can be performed with respect to the pixel circuits in a first row; and then the threshold detection, the compensation value establishment, and the threshold compensation can be performed with respect to the pixel circuits in a fifth row; next, the threshold detection, the compensation value establishment, and the threshold compensation can be performed with respect to the pixel circuits in a second row; . . . until the threshold detection, the compensation value establishment, and the threshold compensation are performed with respect to all the pixel circuits included by the display panel, such that the threshold compensation in one display period of the display panel is realized.

It should be noted that other steps which is indispensable to the driving method for the display panel can refer to conventional driving method for the display panel, this can be understood by those skilled in the art, and no further descriptions will be given here.

For example, the driving method for the display panel provided by the embodiments of the present disclosure can decrease the time required for detecting the threshold, such that the threshold detection of the pixel circuit can be performed during the display panel is turned on (for example, performed in the time period located between adjacent display periods), such that real-time compensation can be realized, and the threshold compensation result and the luminance uniformity of the display panel adopting the driving method can be improved.

At least one embodiment of the present disclosure further provides a pixel circuit, a sensing line and a control circuit, in which the pixel circuit includes a driving transistor, the driving transistor includes a gate electrode and a first terminal, the first terminal of the driving transistor is electrically connected to the sensing line; and the control circuit is configured to perform the detection method provided by any one of the embodiments of present disclosure.

Figure 8:
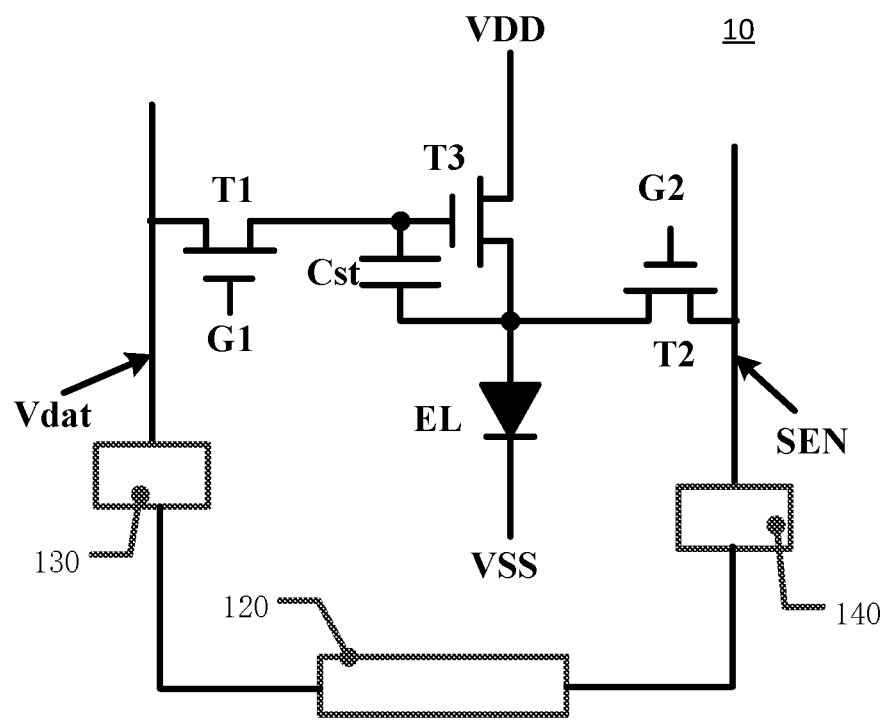
FIG. 8 is a schematic diagram of a display panel provided by at least one embodiment of the present disclosure.

For example, FIG. 8 illustrates a schematic diagram of a display panel provided by the embodiments of present disclosure. For example, as illustrated in FIG. 8, the display panel includes a pixel circuit, a sensing line and a control circuit 120. A pixel unit in a display area of the display panel includes the pixel circuit, and the control circuit 120 is provided at the peripheral area outside the display area. The pixel circuit includes a driving transistor, and the driving transistor includes a gate electrode and a first terminal. The sensing line is electrically connected to the first terminal of the driving transistor. For example, the control circuit 120 is configured to perform the detection method provided by any one of the embodiments of present disclosure. For example, the specific implementation method of the detection method provided by the present embodiment can refer to the embodiments as illustrated in FIG. 2, and no further descriptions will be given here.

For example, the display panel can further include a data driving circuit 130, a detection circuit 140 and a scan driving circuit (not illustrated in figures), which are also provided in the peripheral area. For example, the control circuit 120 is further configured to control the data driving circuit 130 and the detection circuit 140. For example, the data driving circuit 130 is configured to provide the first data voltage and the second data voltage at different time according to specific implementation demands. The scan driving circuit is configured to provide scan signals to the first transistor and the second transistor, so as to turn on or turn off the first transistor and the second transistor.

For example, the pixel circuit is further configured to receive the first data voltage and the second data voltage, and to apply the first data voltage and the second data voltage to the gate electrode of the driving transistor at different time. For example, the detection circuit 140 is configured to read the first sensed voltage and the second sensed voltage from a sensing line SEN.

For example, the pixel circuit further includes a second transistor T2 and alight-emitting element EL; the light-emitting element EL, for example, can be an organic light emitting diode, but the embodiments of the present disclosure are not limited to this case. For example, the second terminal of the driving transistor and the first terminal of the driving transistor can be configured to be respectively connected to a first power source terminal VDD and a first terminal of the light-emitting element EL, and a second terminal of the light-emitting element EL is connected to a second power source terminal VSS. For example, a first terminal of the second transistor T2 is electrically connected to the first terminal of the driving transistor, and a second terminal of the second transistor T2 is electrically connected to the detection circuit 140. For example, the pixel circuit further includes the sensing line SEN, the sensing line SEN is electrically connected to the second terminal of the above-mentioned the second transistor T2 and the detection circuit 140.

For example, the pixel circuit further includes a first transistor T1 and a storage capacitor Cst. The first transistor T1 is configured to obtain data signals from the data driving circuit 130 and write the data signals into the gate electrode of the driving transistor. The storage capacitor Cst stores the data signals. For example, the pixel circuit can also include a data line Vdat, and a first terminal of the first transistor T1 is connected to the data line Vdat.

For example, the control circuit 120 can also include a processor (not illustrated in figures) and a memory, the memory includes computer executable codes and the data required to execute the computer executable codes, the processor executes the executable codes so as to perform at least part of the detection method provided by any one of the embodiments of present disclosure.

The processor, for example, is a central processing unit (CPU) or a processing unit in other forms having data processing capability and/or instruction execution capability. For example, the processor can be implemented as a general-purpose processor (GPP) and can also be a microcontroller, a microprocessor, a digital signal processor (DSP), a special-purpose image processing chip, a field programmable gate array (FPGA), and the like. The memory, for example, can include a volatile memory and/or a non-volatile memory, for example, can include a read-only memory (ROM), a hard disk, a flash memory, and the like. Correspondingly, the memory can be implemented as one or more computer program products. The computer program products can include computer readable storage media in various forms. One or more executable codes (for example, computer program instructions) can be stored in the computer readable storage medium. The processor can run the program instructions to perform the detection method provided by any one of the embodiments of the present disclosure, so as to obtain the threshold voltage of the driving transistor of the pixel circuit included by the display panel, and realize the threshold compensation function of the display panel. The memory can also store various other application programs and various data, for example, the threshold voltage of each pixel circuit, and various data applied to and/or generated by the application programs.

For example, the display panel provided by the embodiments of the present disclosure can decrease the time required for detecting the threshold, such that the threshold detection of the driving transistor of the pixel circuit can be performed during the display panel is turned on (for example, performed in the time period located between adjacent display periods), such that real-time detection and compensation can be realized during the display panel is turned on, and the threshold compensation result and the luminance uniformity of the display panel can be improved.

The following statements should be noted:
(1) The accompanying drawings involve only the structure (s) in connection with the embodiment (s) of the present disclosure, and other structure (s) can be referred to common design (s).
(2) In case of no conflict, features in one embodiment or in different embodiments can be combined.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A detection method for a pixel circuit, the pixel circuit comprising a driving transistor, the driving transistor comprising a gate electrode and a first terminal, the first terminal of the driving transistor being electrically connected to a sensing line, the detection method comprising:
applying a data voltage and a setting voltage to the driving transistor so as to obtain a sensed voltage, wherein
the data voltage and the setting voltage are respectively applied to the gate electrode and the first terminal of the driving transistor so as to set the driving transistor to be in a saturation region,
the gate electrode of the driving transistor is set to be in a suspension state when the driving transistor is maintained in the saturation region, and
the sensed voltage is obtained through the sensing line after a pre-determined time period; and
obtaining a threshold voltage of the driving transistor based on the data voltage, the setting voltage and the sensed voltage.

2. The detection method for the pixel circuit according to claim 1, wherein the data voltage and the setting voltage are applied so as to set the driving transistor to be in a deep saturation region.

3. The detection method for the pixel circuit according to claim 1, wherein applying of the data voltage and the setting voltage to the driving transistor so as to obtain the sensed voltage comprises:
performing a first detection operation, and applying a first data voltage and a first setting voltage to the driving transistor so as to obtain a first sensed voltage, and
performing a second detection operation, and applying a second data voltage and a second setting voltage to the driving transistor so as to obtain a second sensed voltage, and
wherein the threshold voltage of the driving transistor is obtained based on the first data voltage, the second data voltage, the first setting voltage and the second setting voltage.

4. The detection method for the pixel circuit according to claim 3, wherein the first data voltage is not equal to the second data voltage; and the first setting voltage is equal to the second setting voltage.

5. The detection method for the pixel circuit according to claim 3, wherein the first detection operation and the second detection operation are performed continuously.

6. The detection method for the pixel circuit according to claim 3, wherein a pre-determined time gap is provided between adjacent display periods; and the first detection operation and the second detection operation are performed in same one pre-determined time gap.

7. The detection method for the pixel circuit according to claim 3, wherein a time length of a first pre-determined time period for the first detection operation is equal to a time length of a second pre-determined time period for the second detection operation.

8. The detection method for the pixel circuit according to claim 7, wherein the threshold voltage is obtained through a following equation:

$$Vth = \frac{Vgs2 - Vgs1\sqrt{Vvc2/Vvc1}}{1 - \sqrt{Vvc2/Vvc1}},$$

where Vth is the threshold voltage,
Vgs1 is a voltage difference between the first data voltage and the first setting voltage,
Vgs2 is a voltage difference between the second data voltage and the second setting voltage,
Vvc1 is the first sensed voltage, and
Vvc2 is the second sensed voltage.

9. The detection method for the pixel circuit according to claim 3, wherein the pixel circuit further comprises a first transistor and a storage capacitor, a first terminal of the first transistor and a second terminal of the first transistor are respectively connected to a signal line and the gate electrode of the driving transistor,
a first terminal of the storage capacitor and a second terminal of the storage capacitor are respectively connected to the gate electrode of the driving transistor and the first terminal of the driving transistor; and
the detection method further comprises:
applying the data voltage to the driving transistor through turning on the first transistor, and
setting the gate electrode of the driving transistor to be in the suspension state through turning off the first transistor.

10. The detection method for the pixel circuit according to claim 9, wherein the pixel circuit further comprises a second transistor, a first terminal of the second transistor is connected to the first terminal of the driving transistor, and a second terminal of the second transistor is connected to the sensing line; and
the detection method further comprises:
applying the setting voltage to the first terminal of the driving transistor through turning-on the second transistor.

11. The detection method for the pixel circuit according to claim 2, wherein applying of the data voltage and the setting voltage to the driving transistor so as to obtain the sensed voltage comprises:
performing a first detection operation, and applying a first data voltage and a first setting voltage to the driving transistor so as to obtain a first sensed voltage, and performing a second detection operation, and applying a second data voltage and a second setting voltage to the driving transistor so as to obtain a second sensed voltage; and
wherein the threshold voltage of the driving transistor is obtained based on the first data voltage, the second data voltage, the first setting voltage and the second setting voltage.

12. The detection method for the pixel circuit according to claim 11, wherein the first data voltage is not equal to the second data voltage; and the first setting voltage is equal to the second setting voltage.

13. The detection method for the pixel circuit according to claim 12, wherein the first detection operation and the second detection operation are performed continuously.

14. The detection method for the pixel circuit according to claim 13, wherein a pre-determined time gap is provided between adjacent display periods; and the first detection operation and the second detection operation are performed in same one pre-determined time gap.

15. The detection method for the pixel circuit according to claim 14, wherein a time length of a first pre-determined time period for the first detection operation is equal to a time length of a second pre-determined time period for the second detection operation.

16. The detection method for the pixel circuit according to claim 4, wherein both the first setting voltage and the second setting voltage are equal to zero.

17. The detection method for the pixel circuit according to claim 16, wherein the first data voltage is smaller than the second data voltage.

18. A driving method for a display panel, the display panel comprising a pixel circuit and a sensing line, the pixel circuit comprising a driving transistor, the driving transistor comprising a gate electrode and a first terminal, the first terminal of the driving transistor being electrically connected to the sensing line, the driving method comprising:
performing the detection method according to claim 1 to the pixel circuit, so as to obtain the threshold voltage of the driving transistor of the pixel circuit.

19. The driving method for the display panel according to claim 18, further comprising:
establishing a compensation value for the pixel circuit according to the threshold voltage.

20. A display panel, comprising a pixel circuit, a sensing line and a control circuit, wherein
the pixel circuit comprises a driving transistor, the driving transistor comprises a gate electrode and a first terminal, the first terminal of the driving transistor is electrically connected to the sensing line; and
the control circuit is configured to perform the detection method according to claim 1.

* * * * *